United States Patent [19]
Letavic et al.

[11] Patent Number: 6,127,703
[45] Date of Patent: Oct. 3, 2000

[54] LATERAL THIN-FILM SILICON-ON-INSULATOR (SOI) PMOS DEVICE HAVING A DRAIN EXTENSION REGION

[75] Inventors: Theodore Letavic, Putnam Valley; Mark Simpson, Ossining, both of N.Y.

[73] Assignee: Philips Electronics North America Corporation, New York, N.Y.

[21] Appl. No.: 09/387,628

[22] Filed: Aug. 31, 1999

[51] Int. Cl.$^7$ .......................... H01L 27/01; H01L 27/12; H01L 31/0392
[52] U.S. Cl. .......................... 257/347; 257/344; 257/408
[58] Field of Search .................... 257/347, 350, 257/351, 352, 353, 344, 408

[56] References Cited

U.S. PATENT DOCUMENTS

| | | | |
|---|---|---|---|
| 5,246,870 | 9/1993 | Merchant | 437/21 |
| 5,300,448 | 4/1994 | Merchant et al. | 437/41 |
| 5,412,241 | 5/1995 | Merchant | 257/409 |
| 5,438,220 | 8/1995 | Nakagawa et al. | 257/487 |
| 5,710,451 | 1/1998 | Merchant | 257/347 |
| 5,780,900 | 7/1998 | Suzuki et al. | 257/335 |
| 5,874,768 | 2/1999 | Yamaguchi et al. | 257/493 |
| 6,002,154 | 12/1999 | Fujita | 257/349 |
| 6,023,090 | 2/2000 | Letavic et al. | 257/347 |

FOREIGN PATENT DOCUMENTS 09205212  8/1997  Japan .......................... H01L 29/786

*Primary Examiner*—Ngân V. Ngô
*Attorney, Agent, or Firm*—Steven R. Biren

[57] ABSTRACT

A lateral thin-film Silicon-On-Insulator (SOI) PMOS device includes a semiconductor substrate, a buried insulating layer on the substrate and a lateral PMOS transistor device in an SOI layer on the buried insulating layer and having a source region of p-type conductivity formed in a body region of n-type conductivity. A lateral drift region of n-type conductivity is provided adjacent the body region, and a drain region of p-type conductivity is provided laterally spaced apart from the body region by the drift region. A gate electrode is provided over a part of the body region in which a channel region is formed during operation and extending over a part of the lateral drift region adjacent the body region, with the gate electrode being insulated from the body region and drift region by an insulation region. In order to simply and economically implement the PMOS transistor device, the lateral drift region is provided with a linearly-graded charge profile over at least a major portion of its lateral extent and a surface-adjoining p-type conductivity drain extension region is provided in the drift region and extends from the drain region to adjacent to, but not in direct contact with, the source region.

6 Claims, 1 Drawing Sheet

LATERAL THIN-FILM SILICON-ON-INSULATOR (SOI) PMOS DEVICE HAVING A DRAIN EXTENSION REGION

BACKGROUND OF THE INVENTION

The invention is in the field of Semiconductor-On-Insulator (SOI) devices, and relates more particularly to lateral SOI PMOS devices suitable for high-voltage applications. In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of lateral thin-film SOI device includes a semiconductor substrate, a buried insulating layer on the substrate, and a lateral transistor device in an SOI layer on the buried insulating layer, with the device, such as a MOSFET, including a semiconductor surface layer on the buried insulating layer and having a source region of a first conductivity type formed in a body region of a second conductivity type opposite to that of the first, an insulated gate electrode over a channel region of the body region and insulated therefrom, a lateral drift region of the first conductivity type, and a drain region of the first conductivity type laterally spaced apart from the channel region by the drift region.

A device of this type is shown in FIG. 1 common to related U.S. Pat. Nos. 5,246,870 (directed to a method) and 5,412,241 (directed to a device), commonly-assigned with the instant application and incorporated herein by reference. The device shown in FIG. 1 of the aforementioned patents is a lateral SOI MOSFET device having various features, such as a thinned SOI layer with a linear lateral doping region and an overlying field plate, to enhance operation. As is conventional, this device is an n-channel or NMOS transistor, with n-type source and drain regions, manufactured using a process conventionally referred to as NMOS technology.

Although the trend in thin-film SOI devices is toward having a thinned SOI layer, there are certain advantages, such as simplicity, ease of fabrication and lower fabrication cost, to an unthinned device, such as the device shown in U.S. Pat. No. 5,300,448, commonly-assigned with the instant application and incorporated herein by reference.

Although devices of the types described above are generally n-channel devices, manufactured using NMOS technology, as noted above, it would be desirable to implement p-channel or PMOS high-voltage transistors using the standard technology. One way of accomplishing this is shown in U.S. Pat. No. 5,710,451, also commonly-assigned with the instant application and incorporated herein by reference. However, the structures shown in this reference require a semiconductor link-up region and are accordingly more complex and expensive to manufacture, and can function as PMOS transistors only in certain operating modes.

Thus, it will be apparent that numerous techniques and approaches have been used in order to enhance the performance of power semiconductor devices, in an ongoing effort to attain a more nearly optimum combination of such parameters as breakdown voltage, size, current-carrying capability and manufacturing ease. While all of the foregoing structures provide varying levels of improvement in device performance, no one device or structure fully optimizes all of the design requirements for high-voltage, high-current operation with the flexibility to fabricate PMOS as well as NMOS devices.

Accordingly, it would be desirable to have a transistor device structure capable of high performance in a high-voltage, high-current environment, in a relatively simple and economical design capable of implementing PMOS structures using conventional technology.

SUMMARY OF THE INVENTION

It is therefore an object of the present invention to provide a transistor device structure capable of high-performance in a high-voltage, high-current environment. It is a further object of the invention to provide such a transistor device structure in which PMOS devices can be simply and economically implemented, using conventional technology.

In accordance with the invention, these objects are achieved in a lateral thin-film SOI PMOS device structure of the type described above in which the lateral drift region is provided with a linearly-graded charge profile such that the doping level in the lateral drift region increases in a direction from the drain region toward the source region, and in which a surface-adjoining p-type conductivity drain extension region is provided in the drift region and extends from the drain region to adjacent to, but not in direct contact with, the source region.

In a preferred embodiment of the invention, a dielectric layer is provided over the drift region and a conductive field plate is provided on the dielectric layer and over at least a portion of the drift region.

In a further preferred embodiment of the invention, the conductive field plate is connected to the source region of the PMOS device.

Lateral thin-film SOI PMOS devices in accordance with the present invention offer a significant improvement in that a combination of favorable performance characteristics making the devices suitable for operation in a high-voltage, high-current environment, and in particular high breakdown voltage, can be achieved in a relatively simple and economical design capable of implementing PMOS structures using conventional technology.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
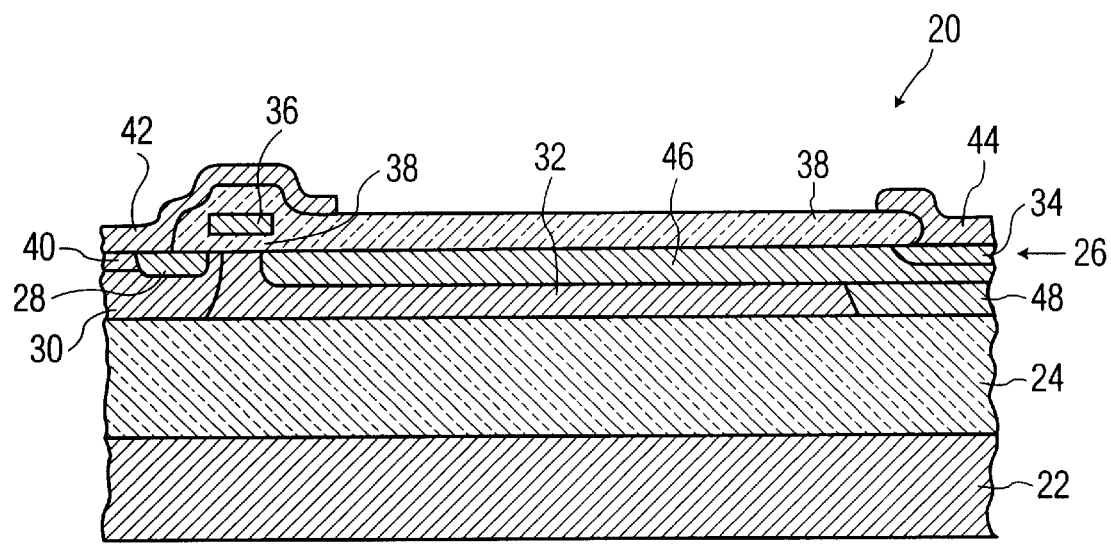
FIG. 1 shows a simplified cross-sectional view of a lateral thin-film SOI PMOS device in accordance with a preferred embodiment of the invention.

In the drawing, semiconductor regions having the same conductivity type are generally shown hatched in the same direction in the cross-sectional views, and it should be understood that the figures are not drawn to scale.

DESCRIPTION OF THE PREFERRED EMBODIMENTS

In the simplified cross-sectional view of FIG. 1, a lateral thin-film device, here an SOI PMOS transistor 20, includes a semiconductor substrate 22, a buried insulating layer 24, and a semiconductor surface SOI layer 26 in which the device is fabricated. The PMOS transistor includes a source region 28 of p-type conductivity, a body region 30 of n-type conductivity, a lateral drift region 32 of n-type conductivity and a drain region 34, of p-type conductivity. The basic device structure also includes a gate electrode 36, shown as completely insulated from the underlying semiconductor surface layer 26 and other conductive portions of the device by an oxide insulation region 38.

Additionally, the PMOS transistor 20 may include a body contact surface region 40, in contact with source region 28, located in the body region 30 and of the same conductivity type as the body region but more highly doped than the body region. Electrical contact to the source region 28 is provided by a source contact electrode 42, while the drain region 34 is provided with a drain contact electrode 44.

It will be understood that the simplified, representative devices shown in the figures depict particular device structures, but that wide variations in both device geometry and configuration can be used within the scope of the invention.

In accordance with the invention, PMOS transistor 20 is provided with a surface-joining p-type conductivity drain extension region 46 in the drift region 32 and extending from the area of the drain region 34 to adjacent to, but not in direct contact with, the source region 28. Additionally, a buffer region 48 of p-type conductivity can optionally be provided in the drift region 32 and extending below the drain region 34 from the drain extension region 46 down to the buried insulation layer 24.

The lateral drift region 32 is provided with a linearly-graded charge profile over at least a major portion of its lateral extent such that the doping level in the lateral drift region increases in a direction from the drain region 34 toward the source region 28. The combination of a linearly-graded charge profile in the lateral drift region and a p-type conductivity drain extension which forms a surface p-n junction with the n-type drift region 32 results in a new device configuration which supports voltage by a combination of junction and MOS RESURF mechanisms.

Figure 2:
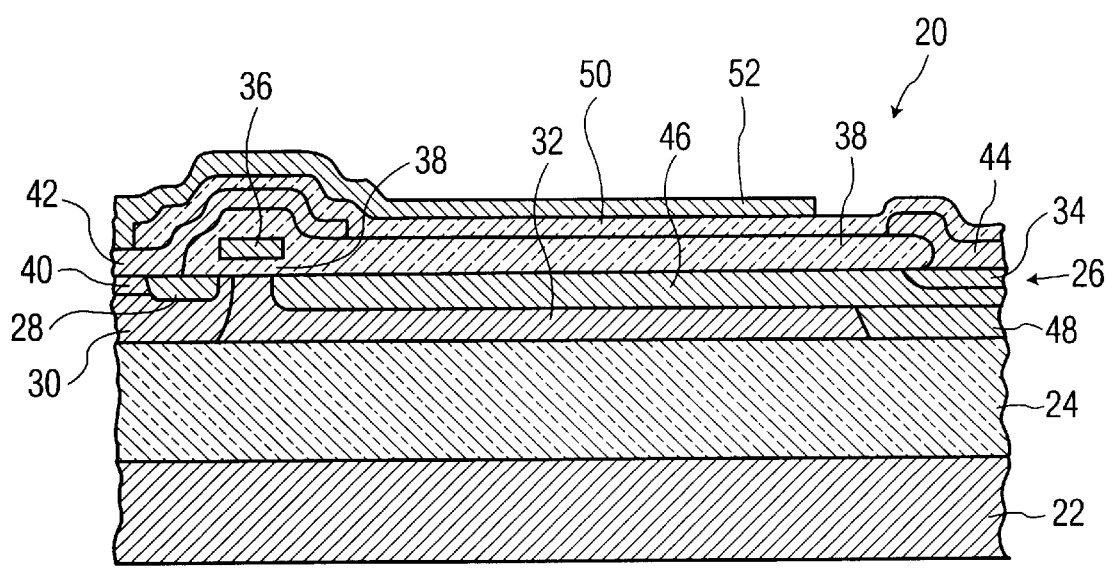
FIG. 2 shows a simplified cross-sectional view of a further preferred embodiment of a lateral thin-film SOI PMOS device in accordance with the invention.

In the simplified cross-sectional view of FIG. 2, a second embodiment of a lateral thin-film SOI PMOS device is shown. Since the underlying structure of this device is similar to that of the device shown in FIG. 1, and like elements have been provided with like reference numerals for ease of identification, the portions of FIG. 2 which are common to FIG. 1 will not be described in further detail in the interest of brevity. The structure of FIG. 2 differs from that of FIG. 1 in that a dielectric layer 50 is provided over the PMOS device of FIG. 1, and a conductive field plate 52 is provided on the dielectric layer 50 and over at least a portion of the drift region. In a preferred embodiment of the invention, conductive field plate 52 is provided over a major portion of the drift region 32 and is connected to the source region 28 through source electrode 42.

While it will be recognized that many different configurations and alternatives with respect to design parameters and materials are contemplated within the scope of the invention, various representative design parameters and materials will be presented by way of nonlimitative example, focusing on those portions of the devices which differ from convention prior-art structures.

As noted above, the PMOS devices of the present invention are formed in nonthinned SOI layers, thus avoiding the time, expense and complication inherent in forming relatively thick local oxide regions as is done in many state-of-the-art devices. Typically, the nonthinned SOI layer 26 used in the present invention may have a thickness in the range of about 1.0 to 1.5 microns, with the surface-adjoining p-type conductivity drain extension region 46 having a thickness of about 0.5 microns. A typical background doping level for the n-type portion of the SOI layer would be in the range of about $5 \times 10^{15}$ to $1 \times 10^{16}$ cm$^{-3}$, with a linearly-graded charge profile being provided over at least a major portion of the lateral drift region in the SOI layer by providing a maximum n-type implant of $1.6 \times 10^{13}$ to $2.0 \times 10^{13}$ cm$^{-2}$ with a linear charge grading from the drain to the source in the range of about $9.0 \times 10^{10}$ to $1.6 \times 10^{11}$ cm$^{-2}$/micron, such that the doping level in the lateral drift region increases in a direction from the drain region toward the source region. The linearly-graded charge profile may be provided over the entire lateral extent of the drift region, or over a major portion but less than all of its lateral extent. The surface-adjoining drain extension region is doped with a p-type conductivity dopant in the range of about $2 \times 10^{12}$ to $6 \times 10^{12}$ cm$^{-2}$ such that the drain extension region has a nominal sheet resistance of about 7,000 ohms/square.

The source and drain regions (28, 34) are of p-type conductivity and doped to a level of about $2 \times 10^{15}$ cm$^{-2}$ and the n-type body region 30 is doped to a level in the range of about $1 \times 10^{13}$ cm$^{-2}$ to $5 \times 10^{13}$ cm$^{-2}$. It should be noted that the use of a separate doping step to form the body region is optional, as the body region may alternatively be formed from a portion of the n-typed typed drift region 32. The buffer region 48 (optional) is doped to a level in the range of about $1 \times 10^{13}$ to $3 \times 10^{13}$ cm$^{-2}$ while the n-type conductivity body contact surface region 40 is doped to a level of about $2 \times 10^{15}$ cm$^{-2}$.

In the embodiment of FIG. 2, the conductive field plate 52 is typically formed of a metal such as aluminum, and is provided over the dielectric layer 50, which may typically be in the range of about 1.0–1.5 micron and formed of deposited oxide, nitride or both materials.

It is emphasized that the foregoing parameters constitute representative values only, and it will be recognized that many different configurations and alternatives are contemplated within the scope of the invention, in particular as to doping levels, layer thicknesses, the presence or absence of optional regions, and the like, so long as the essential features of the present invention, in particular providing the lateral drift region with a linearly-graded charge profile over at least a major portion of its lateral extent and providing a surface-adjoining p-type conductivity drain extension region in the drift region, are incorporated.

In the foregoing manner, the present invention provides a lateral SOI device structure capable of high-performance in a high-voltage, high-current environment, while permitting the manufacture of PMOS devices in a simple and economical fashion using convention technology.

While the invention has been particularly shown and described with reference to several preferred embodiments thereof, it will be understood by those skilled in the art that various changes in form and detail may be made without departing from the spirit or scope of the invention. In this application it should be understood that the word "a" or "an" preceding an element does not exclude the presence of a plurality of such elements, and that the word "comprising" does not exclude the presence of other elements or steps than those described or claimed.

What is claimed is:

1. A lateral thin-film Silicon-On-Insulator (SOI) PMOS device comprising a semiconductor substrate, a buried insulating layer on said substrate, and a lateral PMOS transistor device in an SOI layer on said buried insulating layer and having a source region of p-type conductivity formed in a body region of n-type conductivity, a lateral drift region of n-type conductivity type adjacent said body region, a drain region of p-type conductivity and laterally spaced apart from said body region by said lateral drift region, and a gate electrode over a part of said body region in which a channel region is formed during operation and extending over a part of said lateral drift region adjacent said body region, said gate electrode being insulated from said body region and drift region by an insulation region, characterized in that said lateral drift region is provided with a linearly-graded charge profile over at least a major portion of its lateral extent such that the doping level in said lateral drift region increases in a direction from said drain region toward said source region, and in that a surface-adjoining p-type conductivity drain extension region is provided in said drift region and extends from said drain region to adjacent to, but not in direct contact with, said source region.

2. A lateral thin-film Silicon-On-Insulator (SOI) PMOS device as in claim 1, wherein said n-type body region is formed from a portion of said n-type drift region.

3. A lateral thin-film Silicon-On-Insulator (SOI) PMOS device as in claim 1, wherein a body contact surface region of n-type conductivity is provided in said body region and contacts said source region.

4. A lateral thin-film Silicon-On-Insulator (SOI) PMOS device as in claim 1, further comprising a buffer region of p-type conductivity in said drift region and extending below said drain region from said drain extension region to said buried insulation layer.

5. A lateral thin-film Silicon-On-Insulator (SOI) PMOS device as in claim 1, further comprising a dielectric layer over said PMOS device and a conductive field plate on said dielectric layer and over at least a portion of said drift region.

6. A lateral thin-film Silicon-On-Insulator (SOI) PMOS device as in claim 5, wherein said conductive field plate is provided over a major portion of said drift region and is connected to said source region of the PMOS device.

* * * * *